(12) United States Patent
Miyamoto et al.

(10) Patent No.: US 11,088,045 B2
(45) Date of Patent: Aug. 10, 2021

(54) SEMICONDUCTOR DEVICE HAVING A COOLING BODY WITH A GROOVE

(71) Applicant: Mitsubishi Electric Corporation, Chiyoda-ku (JP)

(72) Inventors: Noboru Miyamoto, Tokyo (JP); Masao Kikuchi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 519 days.

(21) Appl. No.: 14/806,303

(22) Filed: Jul. 22, 2015

(65) Prior Publication Data
US 2015/0325493 A1   Nov. 12, 2015

Related U.S. Application Data

(62) Division of application No. 13/455,577, filed on Apr. 25, 2012, now abandoned.

(30) Foreign Application Priority Data

Aug. 26, 2011 (JP) .............................. JP2011-184800

(51) Int. Cl.
*H01L 23/10* (2006.01)
*H01L 23/34* (2006.01)
(Continued)

(52) U.S. Cl.
CPC .............. *H01L 23/34* (2013.01); *H01L 23/36* (2013.01); *H01L 24/29* (2013.01); *H01L 24/32* (2013.01);
(Continued)

(58) Field of Classification Search
CPC ............... H01L 23/367; H01L 23/3736; H01L 23/3675; H01L 23/4334;
(Continued)

(56) References Cited

U.S. PATENT DOCUMENTS 5,592,735 A    1/1997  Ozawa et al.
5,838,545 A *  11/1998 Clocher .............. H01L 23/3675
                                                            257/668
(Continued)

FOREIGN PATENT DOCUMENTS

DE          103 31 857 A1    5/2004
DE    10 2009 049 613 A1    8/2010
(Continued)

OTHER PUBLICATIONS

Collins English Dictionary entry, retrieved at www.collinsdictionary.com on May 31, 2017.*

(Continued)

*Primary Examiner* — Ismail A Muse
(74) *Attorney, Agent, or Firm* — Oblon, McClelland, Maier & Neustadt, L.L.P.

(57) ABSTRACT

A semiconductor device includes a semiconductor module having a heat conductive portion formed of metal and also having a molded resin having a surface at which the heat conductive portion is exposed, a cooling body secured to the semiconductor module by means of bonding material, and heat conductive material formed between and thermally coupling the heat conductive portion and the cooling body.

5 Claims, 6 Drawing Sheets

(51) Int. Cl.
  *H01L 23/00* (2006.01)
  *H01L 23/36* (2006.01)
  *H01L 29/06* (2006.01)

(52) U.S. Cl.
  CPC .......... *H01L 24/83* (2013.01); *H01L 29/0657* (2013.01); *H01L 2224/26175* (2013.01); *H01L 2224/27013* (2013.01); *H01L 2224/29013* (2013.01); *H01L 2224/29014* (2013.01); *H01L 2224/2919* (2013.01); *H01L 2224/29191* (2013.01); *H01L 2224/30051* (2013.01); *H01L 2224/30519* (2013.01); *H01L 2224/8314* (2013.01); *H01L 2224/83192* (2013.01); *H01L 2224/83194* (2013.01); *H01L 2924/10155* (2013.01); *H01L 2924/10158* (2013.01); *H01L 2924/13055* (2013.01); *H01L 2924/181* (2013.01); *Y10T 156/10* (2015.01)

(58) Field of Classification Search
  CPC . H01L 2224/8385–83885; H01L 2224/26175; H01L 2224/27013; H01L 2224/29021–29022; H01L 2224/2919–29191; H01L 2023/4043; H01L 2224/30519; H01L 2224/33519; H01L 23/334–4735; H01L 2225/06589; H01L 2224/73103; H01L 2224/73203; H01L 2224/16225–1626; H01L 2224/32225–3226
  See application file for complete search history.

(56) References Cited

U.S. PATENT DOCUMENTS

| | | | |
|---|---|---|---|
| 6,713,864 B1 | 3/2004 | Huang | |
| 8,536,698 B2 | 9/2013 | Miyamoto et al. | |
| 8,637,979 B2 | 1/2014 | Miyamoto | |
| 2004/0017003 A1* | 1/2004 | Saeki | H01L 23/49531 257/694 |
| 2004/0089928 A1 | 5/2004 | Nakajima et al. | |
| 2005/0034888 A1* | 2/2005 | Hoffmann | H01L 24/31 174/558 |
| 2005/0093137 A1 | 5/2005 | Ishikawa et al. | |
| 2006/0067059 A1 | 3/2006 | Ushijima et al. | |
| 2006/0165978 A1 | 7/2006 | Ito et al. | |
| 2006/0214285 A1* | 9/2006 | Wu | H01L 23/36 257/720 |
| 2008/0142955 A1* | 6/2008 | Chen | H01L 23/367 257/713 |
| 2008/0272482 A1* | 11/2008 | Jensen | H01L 23/04 257/705 |
| 2008/0298063 A1* | 12/2008 | Hayashi | B29C 45/14655 362/249.01 |
| 2009/0267214 A1* | 10/2009 | Kumazawa | H01L 23/49524 257/690 |
| 2009/0315192 A1 | 12/2009 | Usami | |
| 2010/0020499 A1 | 1/2010 | Lee et al. | |
| 2010/0243601 A1* | 9/2010 | Uematsu | H05K 3/061 216/20 |
| 2010/0271783 A1* | 10/2010 | Miyashita | G02F 1/133385 361/707 |
| 2010/0308453 A1* | 12/2010 | Scheid | H01L 23/3675 257/698 |
| 2011/0042784 A1 | 2/2011 | Edwards et al. | |
| 2011/0220954 A1* | 9/2011 | Nakai | H01L 33/486 257/99 |
| 2011/0241161 A1* | 10/2011 | Tosaya | H01L 23/16 257/528 |
| 2012/0001318 A1 | 1/2012 | Mamitsu et al. | |
| 2012/0025257 A1* | 2/2012 | Wu | H01L 33/62 257/99 |
| 2012/0043662 A1 | 2/2012 | Ohno | |

FOREIGN PATENT DOCUMENTS

| | | |
|---|---|---|
| JP | 11-111897 A | 4/1999 |
| JP | 2001-250890 | 9/2001 |
| JP | 2002-110872 A | 4/2002 |
| JP | 2003-60137 | 2/2003 |
| JP | 2004-103846 A | 4/2004 |
| JP | 2006-100327 | 4/2006 |
| JP | 2006-210597 | 8/2006 |
| JP | 2006-344770 | 12/2006 |
| JP | 2010-271450 A | 12/2010 |
| JP | 2011-134949 A | 7/2011 |
| WO | 2011/092859 A1 | 8/2011 |

OTHER PUBLICATIONS

U.S. Pat. No. 14/806,303, filed Jul. 22, 2015, Miyamoto et al.
German Office Action dated Apr. 8, 2014, in German patent Application No. 10 2012 214 917.1 (with English translation).
Chinese Office Action dated Sep. 3, 2014, in Chinese patent application No. 201210304452X (with English translation).
Office Action dated Jan. 6, 2015 in Japanese Patent Application No. 2011-184800 (with partial English language translation).
Office Action dated Mar. 31, 2015 in Chinese Patent Application No. 201210304452.X (with English translation).
German Office Action dated Jan. 18, 2018, issued in German Patent Application No. 102012214917.1 (with English translation).

* cited by examiner

US 11,088,045 B2

SEMICONDUCTOR DEVICE HAVING A COOLING BODY WITH A GROOVE

CROSS-REFERENCE TO RELATED APPLICATIONS

This application is a divisional of U.S. patent application Ser. No. 13/455,577, filed Apr. 25, 2012, which claims priority to Japanese Patent Application No. 2011-184800, filed Aug. 26, 2011, the entire contents of which are incorporated herein by reference in their entirety.

BACKGROUND OF THE INVENTION

Field of the Invention

The present invention relates to a semiconductor device used, e.g., for high power control, and a method of manufacture thereof.

Background Art

Japanese Laid-Open Patent Publication No. 2006-100327 discloses a semiconductor device in which a semiconductor module formed by encapsulating a semiconductor element with resin is secured to a cooling fin (or cooling body) by means of screws. Japanese Laid-Open Patent Publication No. 2001-250890 also discloses related art.

In order to reduce the number of parts in such a semiconductor device, it is desirable to secure the semiconductor module to the cooling body without using screws or the like. To accomplish this, the semiconductor module must be secured to the cooling body by way of some adhesive or bonding material which is disposed therebetween. It should be noted that such material must have substantial heat conductivity, as well as providing substantial bonding strength. It has been found, however, that the use of a material suitable for securing the semiconductor module to the cooling body may result in insufficient cooling of the semiconductor module. On the other hand, the use of a material suitable for cooling the semiconductor module may result in inadequate securing of the semiconductor module to the cooling body.

SUMMARY OF THE INVENTION

The present invention has been made to solve the above problems. It is, therefore, an object of the present invention to provide a semiconductor device which has a reduced number of parts, yet in which the semiconductor module is attached to a cooling body with substantial bonding strength and cooled adequately. Another object of the present invention is to provide a method of manufacturing such a semiconductor device. The features and advantages of the present invention may be summarized as follows.

According to one aspect of the present invention, a semiconductor device includes a semiconductor module having a heat conductive portion formed of metal and also having a molded resin having a surface at which the heat conductive portion is exposed, a cooling body secured to the semiconductor module by means of bonding material, and heat conductive material formed between and thermally coupling the heat conductive portion and the cooling body.

According to another aspect of the present invention, a method of manufacturing a semiconductor device, includes the steps of forming heat conductive material on a surface of a cooling body, forming bonding material on the surface of the cooling body, the bonding material having a projection, forming a resin groove in a molded resin of a semiconductor module having a heat conductive portion which is formed of metal and which is exposed at a surface of the molded resin, and integrally securing the cooling body and the semiconductor module together in such a manner that the projection is in contact with an inner wall of the resin groove, and that the heat conductive portion overlaps and is in contact with the heat conductive material.

Other and further objects, features and advantages of the invention will appear more fully from the following description.

DETAILED DESCRIPTION OF THE PREFERRED EMBODIMENTS

First Embodiment

Figure 1:
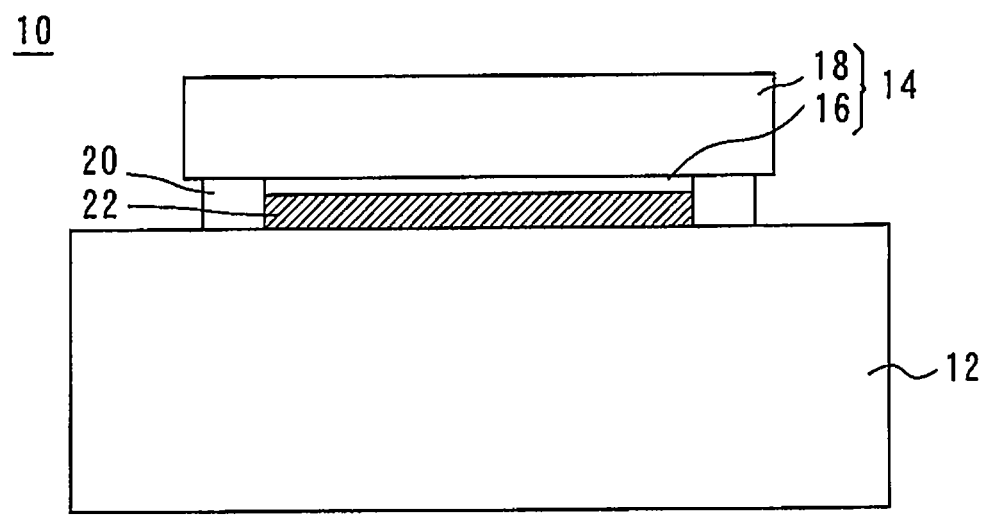
FIG. 1 is a cross-sectional view of a semiconductor device in accordance with a first embodiment of the present invention.

FIG. 1 is a cross-sectional view of a semiconductor device 10 in accordance with a first embodiment of the present invention. The semiconductor device 10 is provided with a cooling body 12. The cooling body 12 is formed of metal, e.g., copper. A semiconductor module 14 is disposed above the cooling body 12. The semiconductor module 14 has a heat conductive portion 16 formed of metal and a molded resin 18 having a surface at which the heat conductive portion 16 is exposed. The semiconductor module 14 is formed, e.g., by encapsulating a semiconductor element, such as an IGBT, with resin by means of transfer molding.

The following description will be directed to components between the semiconductor module 14 and the cooling body 12. A bonding material 20 and a heat conductive material 22 are formed between the semiconductor module 14 and the cooling body 12. The bonding material 20 secures the molded resin 18 of the semiconductor module 14 to the cooling body 12. The bonding material 20 is formed of insulating material. The heat conductive material 22 is formed between and thermally couples the heat conductive portion 16 and the cooling body 12. The heat conductive material 22 is formed of electrically conductive material having excellent heat conductivity.

Figure 2:
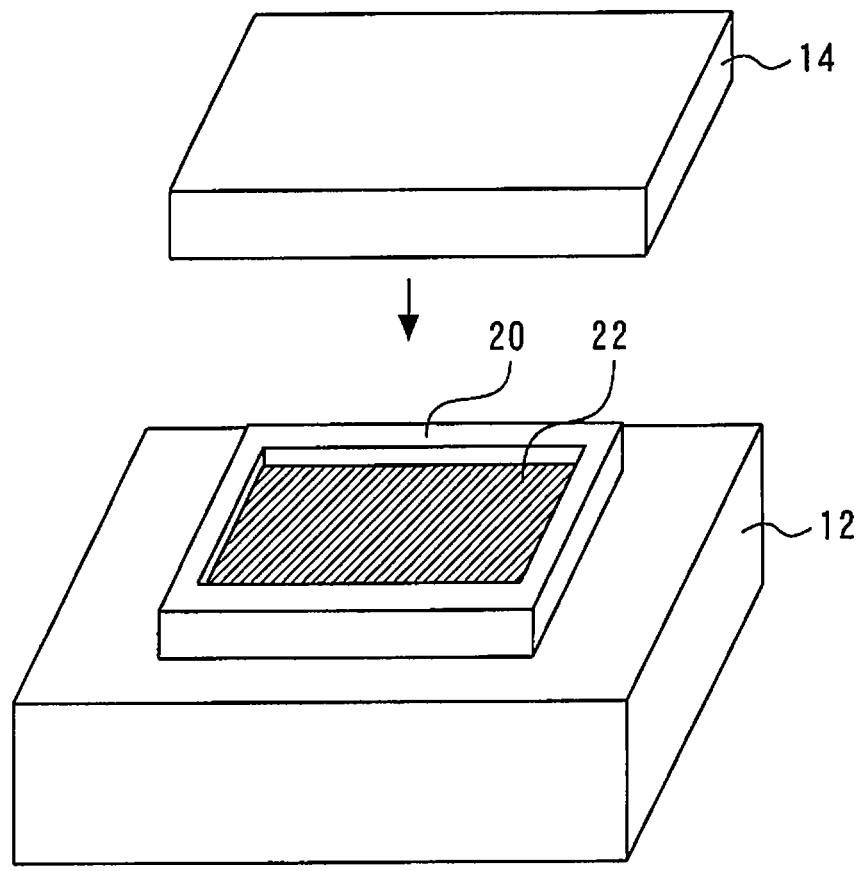
FIG. 2 is a perspective view showing the way in which the semiconductor module of the semiconductor device of the first embodiment is secured to the cooling body.

FIG. 2 is a perspective view showing the way in which the semiconductor module of the semiconductor device of the first embodiment is secured to the cooling body. The bonding material 20 is formed to surround the heat conductive material 22. The semiconductor module 14 is moved in the direction of the arrow of FIG. 2 and brought into bonding engagement with the bonding material 20 so that the semiconductor module 14 is secured to the cooling body 12. As a result, the heat conductive portion 16 and the heat conductive material 22 are separated from the outside by the bonding material 20.

In the semiconductor device of the first embodiment, the semiconductor module 14 is secured to the cooling body 12 by means of the bonding material 20, which is suitable for that purpose, making it possible to attach the semiconductor module 14 to the cooling body 12 with substantial bonding strength. Further, the heat conductive portion 16 is thermally coupled to the cooling body 12 by way of the heat conductive material 22, which is suitable for cooling the semiconductor module 14, making it possible to adequately cool the semiconductor module 14. Further, the semiconductor device 10 has a reduced number of parts, since the semiconductor module 14 is secured to the cooling body 12 without using screws or the like. Thus, although the semiconductor device of the first embodiment has a reduced number of parts, the semiconductor module 14 is attached to the cooling body 12 with substantial bonding strength and cooled adequately.

As is known in the art, materials having higher electrical conductivity have higher heat conductivity. In the semiconductor device of the first embodiment, the heat conductive material 22 is formed of electrically conductive material having excellent heat conductivity, and hence is expected to provide good heat conduction. Furthermore, the heat conductive portion 16 and the heat conductive material 22 are separated from the outside by the bonding material 20, which is formed of insulating material, thereby insulating the heat conductive material 22 from the outside atmosphere. Insulating a semiconductor module from the outside atmosphere is an effective way to maintain the characteristics of the semiconductor module, especially if the module includes a power semiconductor device driven by a high voltage.

Figure 3:
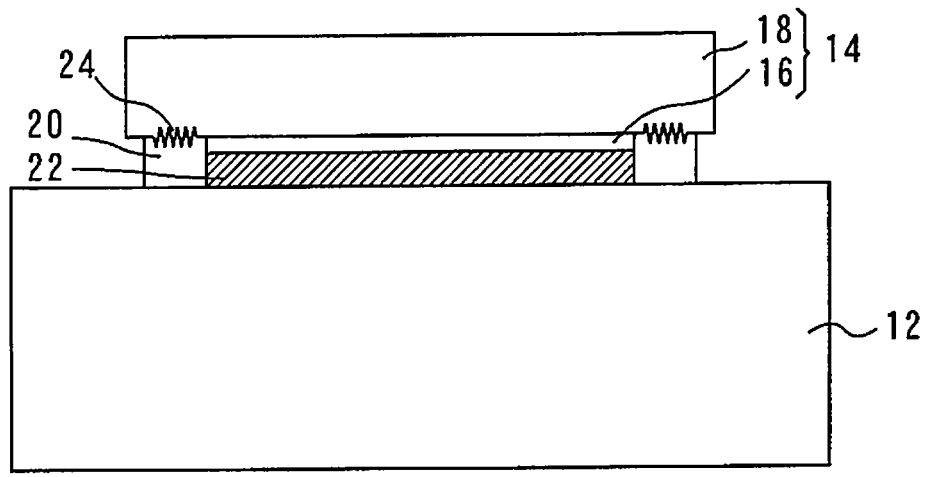
FIG. 3 is a cross-sectional view showing a variation of the semiconductor device of the first embodiment.

FIG. 3 is a cross-sectional view showing a variation of the semiconductor device of the first embodiment. In this variation, an anchor portion 24 is formed in the surface of the molded resin 18 in contact with the bonding material 20, thereby increasing the surface roughness of that surface. As a result, the surface of the molded resin 18 in contact with the bonding material 20 has a greater surface roughness than the surfaces of the molded resin 18 which are not in contact with the bonding material 20. In this way it is possible to increase the bonding strength of the bonding material 20 between the semiconductor module 14 and the cooling body 12.

Figure 4:
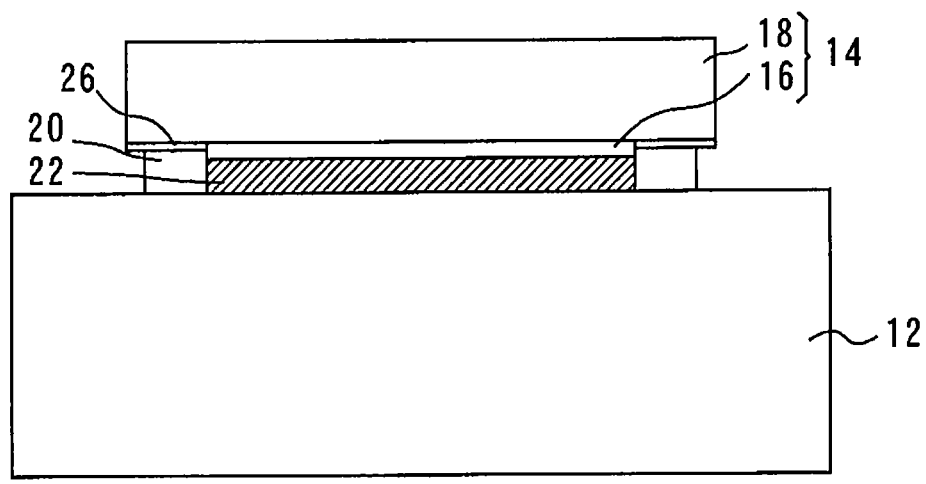
FIG. 4 is a cross-sectional view showing another variation of the semiconductor device of the first embodiment.

FIG. 4 is a cross-sectional view showing another variation of the semiconductor device of the first embodiment. In this variation, the portion of the molded resin 18 in contact with the bonding material 20 has been subjected to hydrophilic treatment, forming a hydrophilic portion 26. Therefore, the portion of the molded resin 18 in contact with the bonding material 20 is more hydrophilic than the portions of the molded resin 18 which are not in contact with the bonding material 20. In this way it is possible to increase the bonding strength of the bonding material 20 between the semiconductor module 14 and the cooling body 12. It should be noted that the bonding strength of the bonding material 20 between the semiconductor module 14 and the cooling body 12 may be increased by subjecting the molded resin 18 to a surface treatment other than those described above.

Various other alterations may be made to the first embodiment without departing from the features of the present invention. For example, the bonding material 20 may be formed of material other than insulating material. Further, although in the first embodiment the heat conductive material 22 is formed of electrically conductive material, it is to be understood that in other embodiments it may be formed of, e.g., silicone grease. When the heat conductive material 22 is formed of an insulating material such as silicone grease, it is easier to insulate the semiconductor module 14. Further, the semiconductor element and the heat conductive portion 16 within the molded resin 18 may be insulated from each other by insulating material in order to ensure the insulation of the semiconductor module.

Second Embodiment

Figure 5:
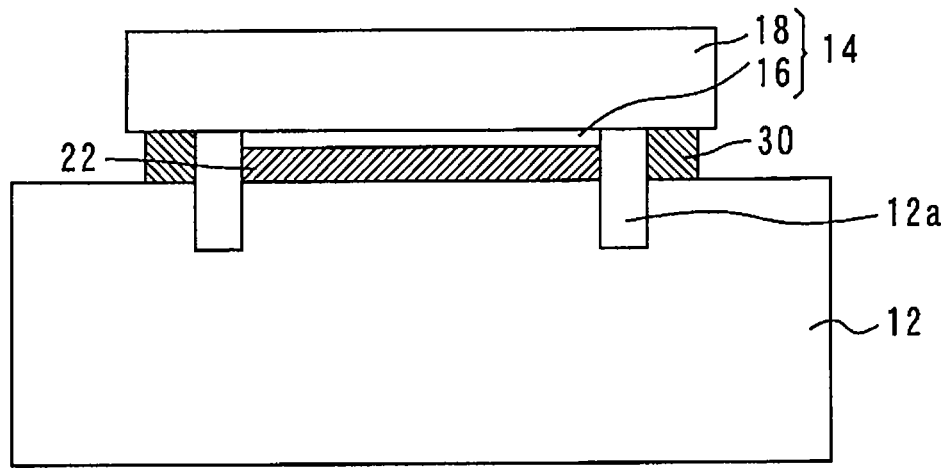
FIG. 5 is a cross-sectional view of the semiconductor device of the second embodiment.

The following description of a semiconductor device in accordance with a second embodiment of the present invention will be primarily limited to the differences from the semiconductor device of the first embodiment in order to avoid undue repetition. FIG. 5 is a cross-sectional view of the semiconductor device of the second embodiment. In this semiconductor device, the cooling body 12 has a cooling body groove 12a formed therein. The heat conductive material 22 is separated from a cooling material 30 by the cooling body groove 12a.

Figure 6:
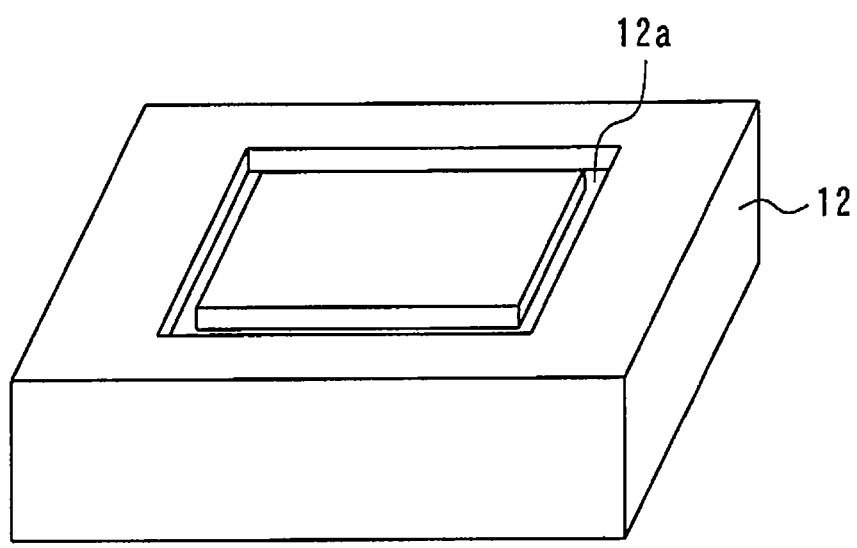
FIG. 6 is a perspective view showing the cooling body of the semiconductor device of the second embodiment.
Figure 7:
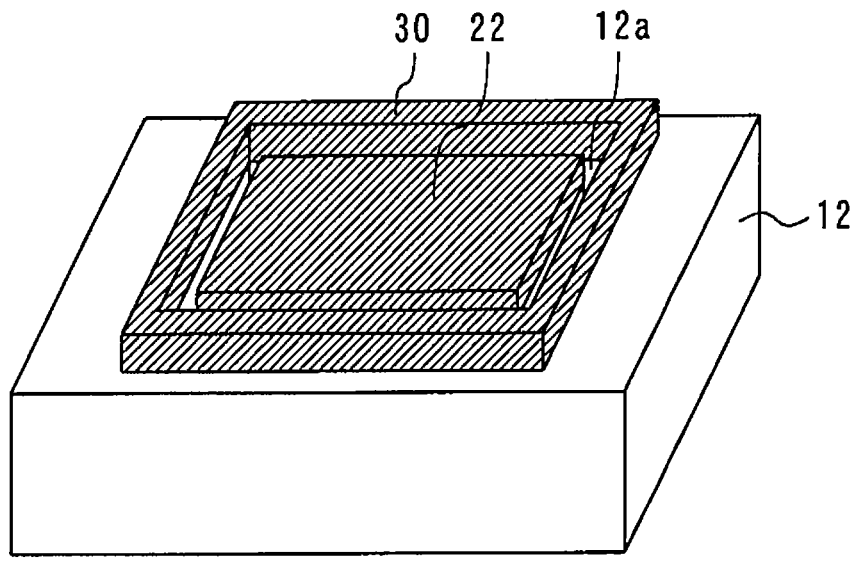
FIG. 7 is a perspective view showing the cooling body, the heat conductive material, and the bonding material in the semiconductor device of the second embodiment.

FIG. 6 is a perspective view showing the cooling body of the semiconductor device of the second embodiment. The cooling body groove 12a, formed in the cooling body 12, has a rectangular annular shape. FIG. 7 is a perspective view showing the cooling body, the heat conductive material, and the bonding material in the semiconductor device of the second embodiment. The bonding material 30 is formed to surround the heat conductive material 22.

As described above in connection with the first embodiment, the heat conductive material 22 serves to cool the semiconductor module 14, and the bonding material 30 serves to bond the semiconductor module 14 to the cooling body 12. Thus, the heat conductive material 22 and the bonding material 30 have different functions. Therefore, mixing or bringing into contact these materials may prevent them from functioning properly. In the semiconductor device of the second embodiment, the heat conductive material 22 and the bonding material 30 are prevented from being mixed or brought into contact with each other, since they are separated from each other by the cooling body groove 12a.

Third Embodiment

Figure 8:
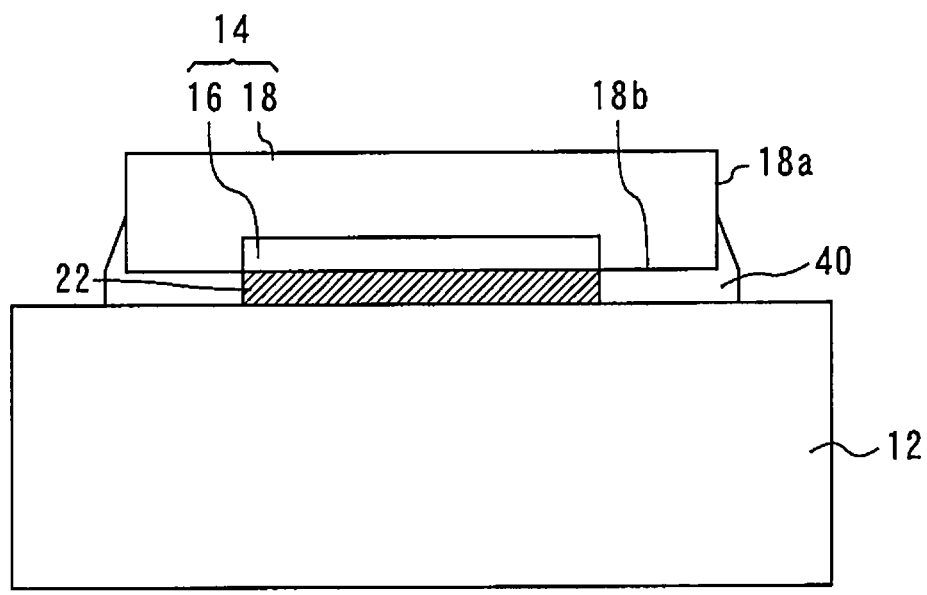
FIG. 8 is a cross-sectional view of the semiconductor device of the third embodiment.

The following description of a semiconductor device in accordance with a third embodiment of the present invention will be primarily limited to the differences from the semiconductor device of the first embodiment in order to avoid undue repetition. FIG. 8 is a cross-sectional view of the semiconductor device of the third embodiment. In this semiconductor device, a bonding material 40 is formed to extend to cover the side surfaces 18a of the molded resin 18. Further, the surface of the heat conductive portion 16 in contact with the heat conductive material 22 and the bottom surface 18b of the molded resin 18 form a single plane.

In the semiconductor device of the third embodiment, since the bonding material 40 extends to cover the side surfaces 18a of the molded resin 18, the bonding strength of the bonding material 40 between the semiconductor module 14 and the cooling body 12 is increased. Further, since the surface of the heat conductive portion 16 in contact with the heat conductive material 22 and the bottom surface 18b of the molded resin 18 form a single plane, the gap between the bottom surface 18b and the cooling body 12 is narrowed, making it easier to form the bonding material 40, which extends to cover the side surfaces 18a of the molded resin 18.

Figure 9:
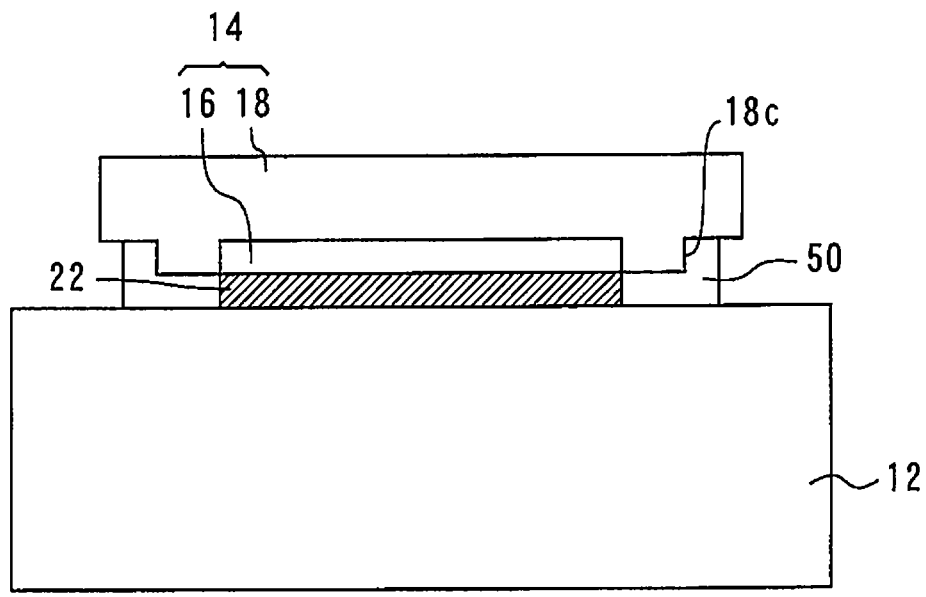
FIG. 9 is a cross-sectional view showing a variation of the semiconductor device of the third embodiment.

FIG. 9 is a cross-sectional view showing a variation of the semiconductor device of the third embodiment. In this variation, the outer circumferential bottom edge of the molded resin 18 has been notched to form side surfaces 18c. A bonding material 50 is formed to extend to cover these side surfaces 18c. As a result of this configuration, the bonding strength between the semiconductor module 14 and the cooling body 12 can be increased by using an amount of bonding material smaller than that used in the semiconductor device described above with reference to FIG. 8.

Fourth Embodiment

Figure 10:
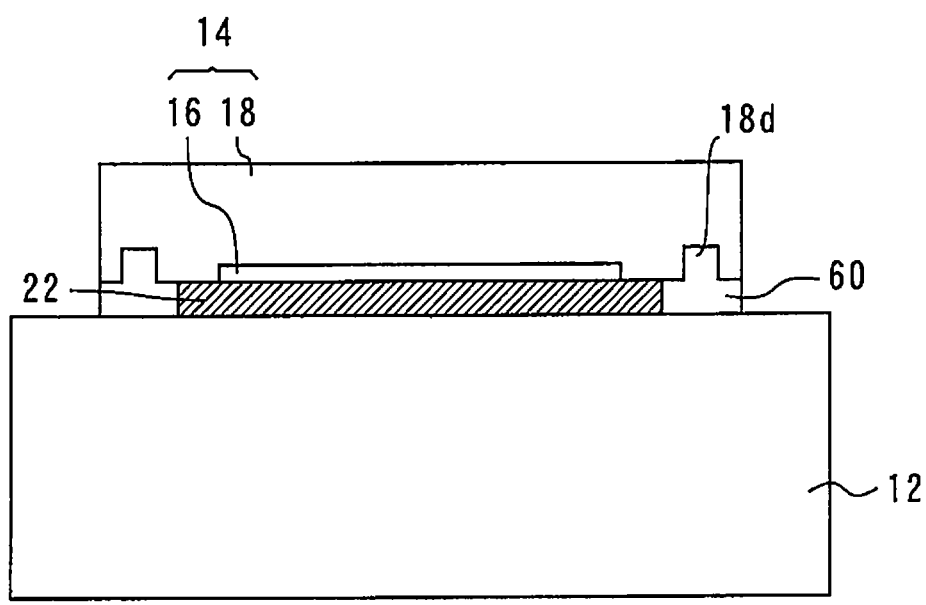
FIG. 10 is a cross-sectional view of the semiconductor device of the fourth embodiment.

The following description of a semiconductor device in accordance with a fourth embodiment of the present invention will be primarily limited to the differences from the semiconductor device of the first embodiment in order to avoid undue repetition. FIG. 10 is a cross-sectional view of the semiconductor device of the fourth embodiment. In this semiconductor device, a resin groove 18d is formed in the surface of the molded resin 18 facing the cooling body 12. A bonding material 60 is formed to fill the resin groove 18d. In the semiconductor device of the fourth embodiment, since the bonding material 60 is formed to fill the resin groove 18d of the molded resin 18, the bonding strength of the bonding material 60 between the semiconductor module 14 and the cooling body 12 is increased.

Fifth Embodiment

Figure 11:
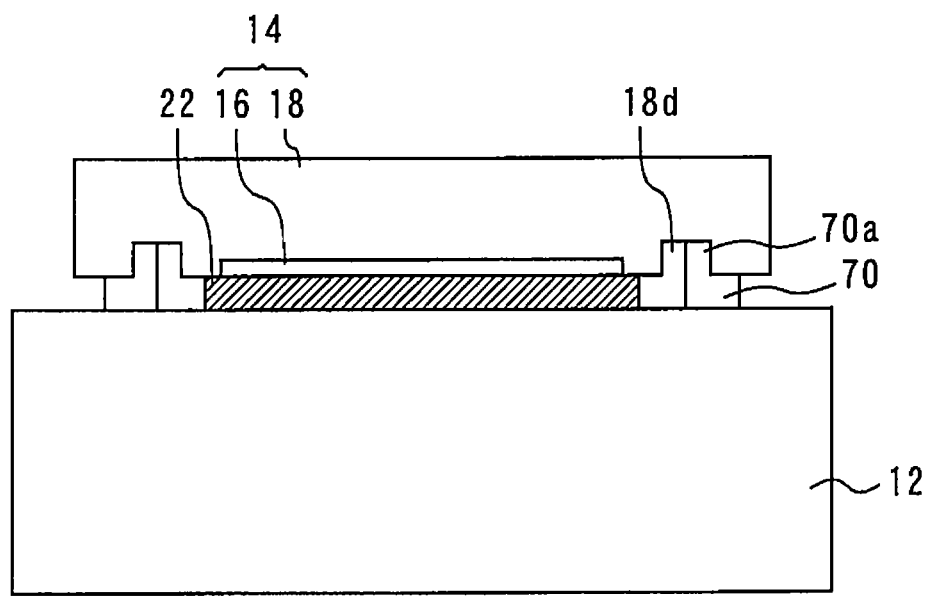
FIG. 11 is a cross-sectional view of the semiconductor device of the fifth embodiment.

The following description of a semiconductor device and a method of manufacture thereof in accordance with a fifth embodiment of the present invention will be primarily limited to the differences from the semiconductor device of the first embodiment in order to avoid undue repetition. FIG. 11 is a cross-sectional view of the semiconductor device of the fifth embodiment. In this semiconductor device, a bonding material 70 has a projection 70a which is in contact with a portion of the inner walls of the resin groove 18d.

Figure 12:
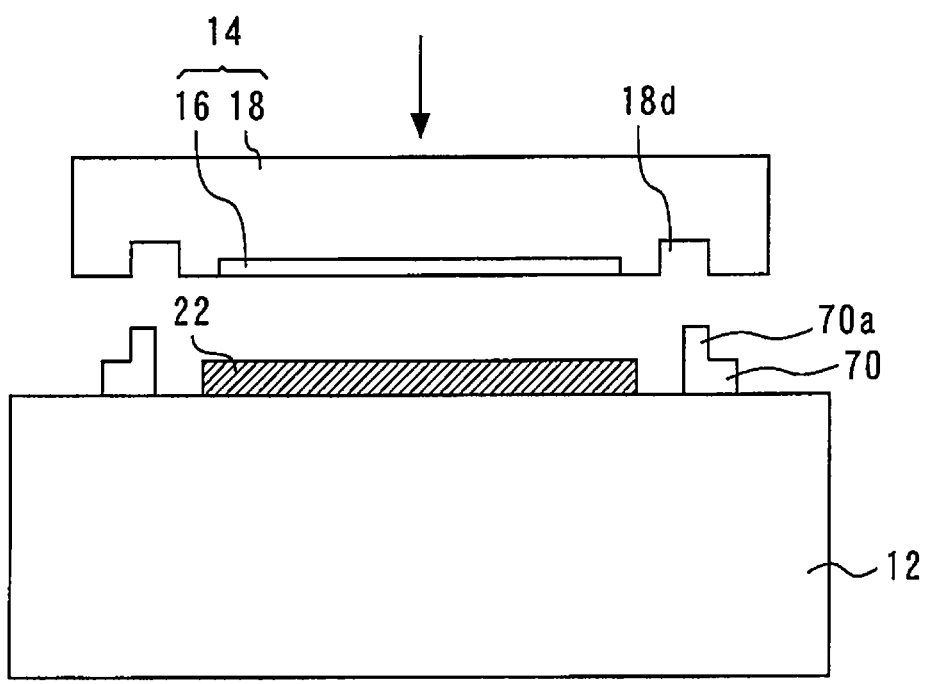
FIG. 12 is a cross-sectional view showing the way in which the cooling body and the semiconductor module of the semiconductor device of the fifth embodiment are integrally secured together.

The method of manufacturing a semiconductor device in accordance with the fifth embodiment will now be described. FIG. 12 is a cross-sectional view showing the way in which the cooling body and the semiconductor module of the semiconductor device of the fifth embodiment are integrally secured together. In this process, first the heat conductive material 22 is formed on the surface of the cooling body 12. Next, the bonding material 70 having the projection 70a is formed on the surface of the cooling body 12. The bonding material 70 is formed at a distance from the heat conductive material 22. The semiconductor module 14 is then formed, which has the heat conductive portion 16 formed of metal and the molded resin 18 having a surface at which the heat conductive portion 16 is exposed. The resin groove 18d is then formed in the molded resin 18. It should be noted that the order of the above process steps may be varied where appropriate.

Next, the cooling body 12 and the semiconductor module 14 are integrally secured together. In this process step, the cooling body 12 and the semiconductor module 14 are integrally secured together in such a manner that the projection 70a is in contact with inner walls of the resin groove 18d, and that the heat conductive portion 16 overlaps and is in contact with the heat conductive material 22. At that time, the cooling body 12 and the semiconductor module 14 are aligned with each other by inserting the projection 70a into the resin groove 18d.

In the semiconductor device manufacturing method of the fifth embodiment, the cooling body 12 and the semiconductor module 14 are integrally secured together using the projection 70a as an alignment guide, making it possible to increase the accuracy of alignment of the components in the semiconductor device. Further, since the projection 70a is in contact with inner walls of the resin groove 18d, the bonding strength between the semiconductor module 14 and the cooling body 12 is increased. Further, since the bonding material 70 is spaced apart from the heat conductive material 22, even if a portion of the bonding material 70 diffuses toward the heat conductive material 22, that portion is retained or trapped in the resin groove 18d, thereby preventing the bonding material 70 from reaching and mixing with the heat conductive material 22.

The semiconductor device manufacturing method of the fifth embodiment is characterized in that the cooling body 12 and the semiconductor module 14 are aligned with each other using the projection 70a when integrally securing them together, and that the projection 70a is brought into bonding engagement with the resin groove 18d in order to increase the bonding strength between the semiconductor module 14 and the cooling body 12. It should be noted that the bonding material 70 need not necessarily be formed at a distance from the heat conductive material 22.

The semiconductor devices described in connection with the second and subsequent embodiments are susceptible of alterations at least similar to those that can be made to the semiconductor device of the first embodiment. Further, features of different embodiments may be combined where appropriate.

In accordance with the present invention, both bonding material and heat conductive material are formed between the semiconductor module and the cooling body in a semiconductor device, making it possible to attach the semiconductor module to the cooling body with substantial bonding strength and adequately cool the semiconductor module while reducing the number of parts in the semiconductor device.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
a heat conductive layer formed of metal;
a molded resin layer having a surface to which said heat conductive layer is exposed;
a cooling body secured to said molded resin layer by a bonding material element between the cooling body and the molded resin layer; and a heat conductive material formed between and thermally coupling said heat conductive layer and said cooling body, wherein said cooling body has a cooling body groove formed therein, said heat conductive material is separated from said bonding material element by said cooling body groove, the bonding material element and the heat conductive material are not in contact with each other, and the bonding material element is formed of insulating material and surrounds the heat conductive material.

2. A semiconductor device comprising:

a heat conductive layer formed of metal;

a molded resin layer covering part of said heat conductive layer and leaving another part of said heat conductive layer exposed from the molded resin layer;

a cooling body secured to said molded resin layer by a bonding material element between the cooling body and the molded resin layer; and a heat conductive material formed between and thermally coupling said heat conductive layer and said cooling body, wherein said cooling body has a cooling body groove formed therein, said heat conductive material is separated from said bonding material element by said cooling body groove, the bonding material element and the heat conductive material are not in contact with each other, and the bonding material element is formed of insulating material and surrounds the heat conductive material.

3. A semiconductor device comprising:

a heat conductive layer formed of metal;

a molded resin layer, a surface of the molded resin layer leaves a part of said heat conductive layer exposed from the molded resin layer;

a cooling body secured to said molded resin layer by a bonding material element between the cooling body and the molded resin layer; and a heat conductive material formed between and thermally coupling said heat conductive layer and said cooling body, wherein said cooling body has a cooling body groove formed therein, said heat conductive material is separated from said bonding material element by said cooling body groove, the bonding material element and the heat conductive material are not in contact with each other, and the bonding material element is formed of insulating material and surrounds the heat conductive material.

4. A semiconductor device comprising:

a heat conductive layer formed of metal;

a molded resin layer, a part of the heat conductive layer is exposed from a surface of the molded resin layer, and another part of the heat conductive layer is not exposed from the surface of the molded resin layer;

a cooling body secured to said molded resin layer by a bonding material element between the cooling body and the molded resin layer; and a heat conductive material formed between and thermally coupling said heat conductive layer and said cooling body, wherein said cooling body has a cooling body groove formed therein, said heat conductive material is separated from said bonding material element by said cooling body groove, the bonding material element and the heat conductive material are not in contact with each other, and the bonding material element is formed of insulating material and surrounds the heat conductive material.

5. A semiconductor device comprising:

a heat conductive layer formed of metal;

a molded resin layer having a surface to which said heat conductive layer is exposed;

a cooling body secured to said molded resin layer by a bonding material element between the cooling body and the molded resin layer; and a heat conductive material formed between and thermally coupling said heat conductive layer and said cooling body, wherein said cooling body has a cooling body groove formed therein, said heat conductive material is separated from said bonding material element by said cooling body groove, the bonding material element and the heat conductive material are not in contact with each other, and the bonding material element is formed of insulating material and surrounds the heat conductive material, wherein an upper surface of the molded resin is exposed to outside.

* * * * *